United States Patent
Pramanik

(10) Patent No.: US 8,921,181 B2
(45) Date of Patent: Dec. 30, 2014

(54) FLOURINE-STABILIZED INTERFACE

(71) Applicant: Intermolecular, Inc., San Jose, CA (US)

(72) Inventor: Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/728,957

(22) Filed: Dec. 27, 2012

(65) Prior Publication Data

US 2014/0183666 A1    Jul. 3, 2014

(51) Int. Cl.
  *H01L 29/66* (2006.01)
  *H01L 21/84* (2006.01)
  *H01L 29/40* (2006.01)
  *H01L 29/423* (2006.01)
  *H01L 29/786* (2006.01)
  *H01L 21/28* (2006.01)

(52) U.S. Cl.
  CPC ........ *H01L 29/401* (2013.01); *H01L 29/42372* (2013.01); *H01L 29/6659* (2013.01); *H01L 29/6656* (2013.01); *H01L 29/7866* (2013.01); *H01L 21/28176* (2013.01); *H01L 21/28202* (2013.01)
  USPC ........... 438/239; 438/162; 438/276; 438/289; 438/290; 438/478; 438/522; 438/532; 438/586; 257/368; 257/386; 257/392; 257/410; 257/412; 257/E21.194; 257/E21.335; 257/E21.616; 257/E27.06

(58) Field of Classification Search
  CPC ............ H01L 29/6656; H01L 29/6659; H01L 29/7866; H01L 21/28176; H01L 21/28202
  USPC ......... 438/162, 239, 276, 289, 290, 478, 522, 438/532, 586; 257/368, 386, 392, 410, 412, 257/E21.194, E21.335, E21.616, E27.06
  See application file for complete search history.

(56) References Cited

U.S. PATENT DOCUMENTS

| | | | | |
|---|---|---|---|---|
| 6,001,675 A | * | 12/1999 | Sandhu et al. | 438/151 |
| 6,756,291 B1 | * | 6/2004 | Hao et al. | 438/586 |
| 2006/0099748 A1 | * | 5/2006 | Satou | 438/162 |
| 2007/0298598 A1 | * | 12/2007 | Takeda et al. | 438/522 |
| 2010/0013017 A1 | * | 1/2010 | Tsutsui | 257/368 |
| 2012/0214286 A1 | * | 8/2012 | Lin et al. | 438/290 |
| 2013/0344665 A1 | * | 12/2013 | Shinhara | 438/239 |

OTHER PUBLICATIONS

Jain et al.; Improved Sub-Micron CMOS Device Performance Due to Flourine in CVD Tungsten Silicide; VLSI Technology Inc.; Dept. of Electrical Engineering and Computer Science, U.C. Berkeley, CA, pp. 91-92.

* cited by examiner

*Primary Examiner* — Dao H Nguyen

(57) ABSTRACT

Methods for forming an electronic device having a fluorine-stabilized semiconductor substrate surface are disclosed. In an exemplary embodiment, a layer of a high-κ dielectric material is formed together with a layer containing fluorine on a semiconductor substrate. Subsequent annealing causes the fluorine to migrate to the surface of the semiconductor (for example, silicon, germanium, or silicon-germanium). A thin interlayer of a semiconductor oxide may also be present at the semiconductor surface. The fluorine-containing layer can comprise F-containing $WSi_x$ formed by ALD from $WF_6$ and $SiH_4$ precursor gases. A precise amount of F can be provided, sufficient to bind to substantially all of the dangling semiconductor atoms at the surface of the semiconductor substrate and sufficient to displace substantially all of the hydrogen atoms present at the surface of the semiconductor substrate.

20 Claims, 3 Drawing Sheets

# FLOURINE-STABILIZED INTERFACE

FIELD OF THE INVENTION

One or more embodiments of the present invention relate to methods of manufacture of semiconductor devices.

BACKGROUND

Current MOS transistors, both planar and three-dimensional (such as FinFETs) use high-κ dielectrics as the gate oxide layer together with a very thin interlayer (IL), typically $SiO_2$. These high-κ dielectrics are used in conjunction with layers of a conductor that are part of the overall gate structure. The work functions of the conductor layers are chosen to provide the right threshold voltages for both n-channels and p-channels. As device size continues to shrink, the reliability of transistors under normal operation has become increasingly problematic. Issues include bias temperature instability (BTI), wherein the transistor characteristics change as a result of voltages applied to the metal gate, and hot electron instability (hot carrier injection or HCI) wherein the transistor characteristics change as a result of injection of energetic carriers from the channel. Many of these reliability issues are connected with interface states at the boundary between the interface layer and the underlying semiconductor substrate (e.g., silicon, germanium, or silicon-germanium). The problems arise as a result of dangling Si and/or Ge atoms at the interface. Typically, after cleaning, the surface atoms are passivated by weakly bound H atoms which are easily displaced or removed, resulting in re-activation of the interface.

One approach to stabilizing the dangling Si or Ge atoms is to attach F atoms. Fluorine binds strongly to both silicon and germanium, and once bonded, the interface becomes stable. For example, Jain et al. demonstrated improved hot carrier lifetime for CVD deposited $WF_6$ and $SiH_4$ compared with sputter deposited $WSi_x$ (Jain, V., et al. 1991 VLSI Technology, Digest of Technical Papers, 1991 Symposium, 28-30 May 1991 VLSI Technology Inc., CA, 91-92). The estimated lifetime for the fluorine-doped $WSi_x$ was nearly double the lifetime of the sputter deposited $WSi_x$ without fluorine. The improved hot carrier lifetime was attributed to the stronger Si—F bond compared to the Si—H bond.

However, introducing fluorine to the interface is challenging. Typically, exposure to fluorine-containing gases provides a means of introducing F atoms to the interface, but the control over the amount of delivered fluorine is imprecise. Excess fluorination of the interface has the effect of creating additional dielectric layers that increase the effective dielectric thickness. It is also possible to use ion implantation methods, but these methods tend to damage other materials in the transistor such as the gate dielectric, and they are not suitable for use with three-dimensional structures, because they are highly directional and cannot provide uniform implantation of F atoms.

SUMMARY OF THE INVENTION

Methods for forming an electronic device having a fluorine-stabilized semiconductor substrate surface are disclosed. In an exemplary embodiment, a layer of a high-κ dielectric material is formed together with a layer containing fluorine on a semiconductor substrate. Subsequent annealing causes the fluorine to migrate to the surface of the semiconductor (for example, silicon, germanium, or silicon-germanium). A thin interlayer (2-5 monolayers) of a semiconductor oxide may also be present at the semiconductor surface. The fluorine-containing layer can comprise F-containing $WSi_x$ formed by ALD from $WF_6$ and $SiH_4$ precursor gases. Other metals and precursor gases can also be used. A precise amount of F can be provided, sufficient to bind to substantially all of the dangling semiconductor atoms at the surface of the semiconductor substrate and sufficient to displace substantially all of the hydrogen atoms present at the surface of the semiconductor substrate. The amount of F is sufficient to prevent changes in the capacitance equivalent thickness (CET) of the first and third layers with use and time. The amount of F does not increase the CET after annealing compared to before annealing. The amount of F is between about $1\times10^{11}$ F atoms per $cm^2$ and about $1\times10^{13}$ F atoms per $cm^2$. The methods can also be used to fluorine-stabilize a surface of a semiconductor substrate In some embodiments, an additional work-function-adjustment layer is formed on one side of the F-containing layer. The work-function-adjustment layer can comprise the same metal silicide as the F-containing layer, or it can comprise other suitable conductors such as metal nitrides.

DETAILED DESCRIPTION

Figure 1:
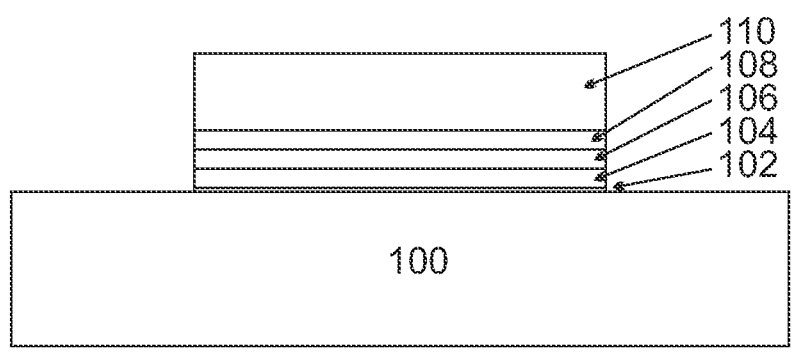
FIG. 1 shows a typical FET gate oxide and electrode stack with a fluorine-containing layer.

Before the present invention is described in detail, it is to be understood that unless otherwise indicated this invention is not limited to specific semiconductor devices or to specific semiconductor materials. Exemplary embodiments will be described for planar transistors and three-dimensional transistors such as FinFETs made on silicon substrates, but other devices can also be fabricated using the methods disclosed. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

DEFINITIONS

The term "FinFET" as used herein refers to a field effect transistor, typically having feature sizes of less than 28 nm, which includes a semiconductor "fin" that extends the semiconductor region between the source and drain above the semiconductor substrate. Fins typically have a high aspect ratio wherein the height of the fin is at least three times the width.

The term "effective oxide thickness" or "EOT" as used herein refers to an equivalent dielectric thickness using a $SiO_2$ layer. Thus the EOT for a $SiO_2$ layer is equal to its physical thickness. The EOT for a high-κ dielectric is greater than its physical thickness by the ratio of the dielectric constant for the material to that of $SiO_2$ (3.9).

The term "capacitance equivalent thickness" or "CET" as used herein refers to an equivalent thickness measured from the slope of a capacitance vs. applied DC voltage curve, where the capacitance is obtained using a small AC voltage superimposed in the DC level. The thickness is referenced to a pure $SiO_2$ layer as for the EOT, but is based on actual electrical measurements on a physical structure which may include more than one dielectric material such as a high-κ dielectric layer and an interface layer. The CET is typically the thickness that is relevant to device performance, and a design goal is frequently to keep it below a maximum value by keeping the interface layer as thin as possible.

Embodiments of the present invention provide novel methods of introducing precise amounts of fluorine that bind with substantially all of the dangling semiconductor atoms, i.e., the atoms that are not completely bonded to other atoms in the semiconductor lattice. In some embodiments, the semiconductor is a Group IV semiconductor. In some embodiments, the Group IV semiconductor is Si, Ge, or SiGe, and the dangling semiconductor atoms can be Si and/or Ge. For example, the semiconductor can be Si, and the dangling semiconductor atoms are Si at the interface layer between a high-κ dielectric layer and a Si substrate. The F atoms bind to any dangling Si bonds and can displace H which has been added to passivate the surface. The passivating H is easily lost due to thermal and electrical stress. The F atoms also displace some of the O which diffuses further into the silicon to form more Si—O bonds, increasing the dielectric thickness.

The Si—F bonds are very stable and hence cannot easily be broken by electrical stress. As a result, the reliability of transistor devices is improved. The presence of semiconductor-F bonds at the semiconductor interface improves the stability of electronic devices such as transistors with respect to electrical stress such as bias temperature instability (BTI), wherein the transistor characteristics change as a result of voltages applied to the metal gate, and hot electron instability (hot carrier injection or HCI), wherein the transistor characteristics change as a result of injection of energetic carriers from the channel. Therefore, threshold voltage and carrier mobility are more stable against changes with electric field and time.

However, if fluorine is present in too large an amount, the net thickness of the dielectric layer (the interlayer along with any oxide layer) increases due to the formation of excess SiF, adding the thickness of a SiF layer. Current 20 nm and below technologies have very tight limits on the overall electrical thickness (capacitance equivalent thickness or "CET") in order to maintain performance. By adjusting the thickness of the fluorine-containing layer (e.g., a $WSi_x$ film containing F), and the volume concentration of F in the film, it is possible to control the amount of F that winds up at the interface. Hence, the inventive methods described herein provide a sufficient amount of fluorine to stabilize the semiconductor surface but not such an excess that would increase the CET.

Accordingly, methods for stabilizing the surface of a semiconductor substrate are provided, where a sufficient amount of fluorine is provided to bond to dangling semiconductor atoms, but not such an excess amount as could impact performance of the electronic device. The methods comprise forming a first layer comprising a high-κ dielectric material, forming a second layer comprising fluorine, and annealing the layers such that fluorine migrates to the surface of the semiconductor substrate. The first layer is disposed between the semiconductor substrate and the second layer.

The fluorine that migrates during the annealing binds with semiconductor atoms at the surface of the semiconductor substrate. The amount of fluorine provided in the second layer is sufficient to bond to substantially all of the dangling semiconductor atoms at the surface of the semiconductor substrate, and is sufficient to displace substantially all of the hydrogen atoms bonded to dangling semiconductor atoms. The amount of fluorine provided in the second layer is sufficient to prevent changes in the capacitance equivalent thickness (CET) of the first and third layers with use and time. The amount of fluorine that migrates during the annealing does not increase the CET after annealing compared to before annealing. The amount of fluorine in the second layer is generally between about $1\times10^{11}$ F atoms per $cm^2$ and about $1\times10^{13}$ F atoms per $cm^2$. The volume concentration of F in the second layer is generally between about $1\times10^{18}$ F atoms per $cm^3$ and about $1\times10^{20}$ F atoms per $cm^3$.

The second layer can be formed by chemical vapor deposition (CVD) or atomic layer deposition (ALD). The fluorine that migrates during the annealing binds with semiconductor atoms at the surface of the semiconductor substrate. In some embodiments, the second layer comprises a metal silicide, such as tungsten silicide. The layer can be formed by CVD or ALD using precursor gases such as $WF_6$ and $SiH_4$ to form a fluorine-containing tungsten silicide layer.

The semiconductor can be a Group IV semiconductor or a Group III-V semiconductor. In some embodiments, the Group IV semiconductor comprises silicon. In some embodiments, the Group IV semiconductor comprises germanium. In some embodiments, the Group IV semiconductor comprises silicon and germanium. While the passivating mechanism discussed herein may apply primarily to semiconductors comprising silicon and germanium, the fluorine passivation methods can also be applied to other semiconductors including III-V semiconductors such as GaAs, InGaAs, GaN, GaP. In III-V semiconductors, fluorine can help to passivate defects at the interface and in the bulk of the semiconductor.

The methods can further comprise forming a third layer between the semiconductor substrate and the first layer, wherein the third layer comprises an oxide (i.e., an interlayer "IL"). The third layer generally comprises 2-5 monolayers. The methods can further comprise forming a fourth layer, where the fourth layer is a work-function-adjustment layer. In some embodiments, the work-function-adjustment layer comprises a metal silicide or a metal nitride. The metal silicide can be tungsten silicide. In some embodiments, the fourth layer is disposed between the first layer and the second layer. In some embodiments, the second layer is disposed between the first layer and the fourth layer. In some embodiments, the second layer and the fourth layer comprise the same metal silicide. In some embodiments, the work-function-adjustment layer does not contain fluorine.

In some embodiments, methods of forming an electronic device having a fluorine-stabilized semiconductor substrate surface are provided. The methods comprise forming a first layer comprising a high-κ dielectric material, forming a second layer comprising fluorine, and annealing the layers such that fluorine migrates to the surface of the semiconductor substrate; wherein the first layer is disposed between the semiconductor substrate and the second layer. The first layer is disposed between the semiconductor substrate and the second layer.

The second layer can be formed by chemical vapor deposition (CVD) or atomic layer deposition (ALD). The fluorine that migrates during the annealing binds with semiconductor atoms at the surface of the semiconductor substrate. In some embodiments, the second layer comprises a metal silicide, such as tungsten silicide. The layer can be formed by CVD or ALD using precursor gases such as $WF_6$ and $SiH_4$ to form a fluorine-containing tungsten silicide layer.

The semiconductor can be a Group IV semiconductor or a Group III-V semiconductor. In some embodiments, the Group IV semiconductor comprises silicon. In some embodiments, the Group IV semiconductor comprises germanium. In some embodiments, the Group IV semiconductor comprises silicon and germanium. While the passivating mechanism discussed herein may apply primarily to semiconductors comprising silicon and germanium, the fluorine passivation methods can also be applied to other semiconductors including III-V semiconductors such as GaAs, InGaAs, GaN, GaP. In III-V semiconductors, fluorine can help to passivate defects at the interface and in the bulk of the semiconductor.

The methods can further comprise forming a third layer between the semiconductor substrate and the first layer, wherein the third layer comprises an oxide (i.e., an interlayer). The third layer generally comprises 2-5 monolayers. The methods can further comprise forming a fourth layer, where the fourth layer is a work-function-adjustment layer. In some embodiments, the work-function-adjustment layer comprises a metal silicide or a metal nitride. The metal silicide can be tungsten silicide. In some embodiments, the fourth layer is disposed between the first layer and the second layer. In some embodiments, the second layer is disposed between the first layer and the fourth layer. In some embodiments, the second layer and the fourth layer comprise the same metal silicide. In some embodiments, the work-function-adjustment layer does not contain fluorine.

In accordance with the methods described herein, electronic devices comprising a fluorine-stabilized semiconductor substrate surface can be prepared. Exemplary electronic devices can include transistors, CMOS image sensors, photovoltaic cells, and the like. For example, a typical gate stack for a field effect transistor (FET) starts with a semiconductor substrate 100 and includes an interface layer (IL) 102 comprising a few angstroms (a couple of monolayers) of $SiO_2$, followed by a high-κ dielectric layer 104 (e.g., $HfO_2$), and a bulk layer 110 (e.g., polycrystalline silicon or tungsten) as shown in FIG. 1. An additional work-function-adjustment layer 106 can be used to adjust the work function. Various materials can be used; one possible choice is $WSi_x$ where x is in the range 2.0-2.5; in some embodiments, x is in the range 2.0-2.2.

Figure 2:
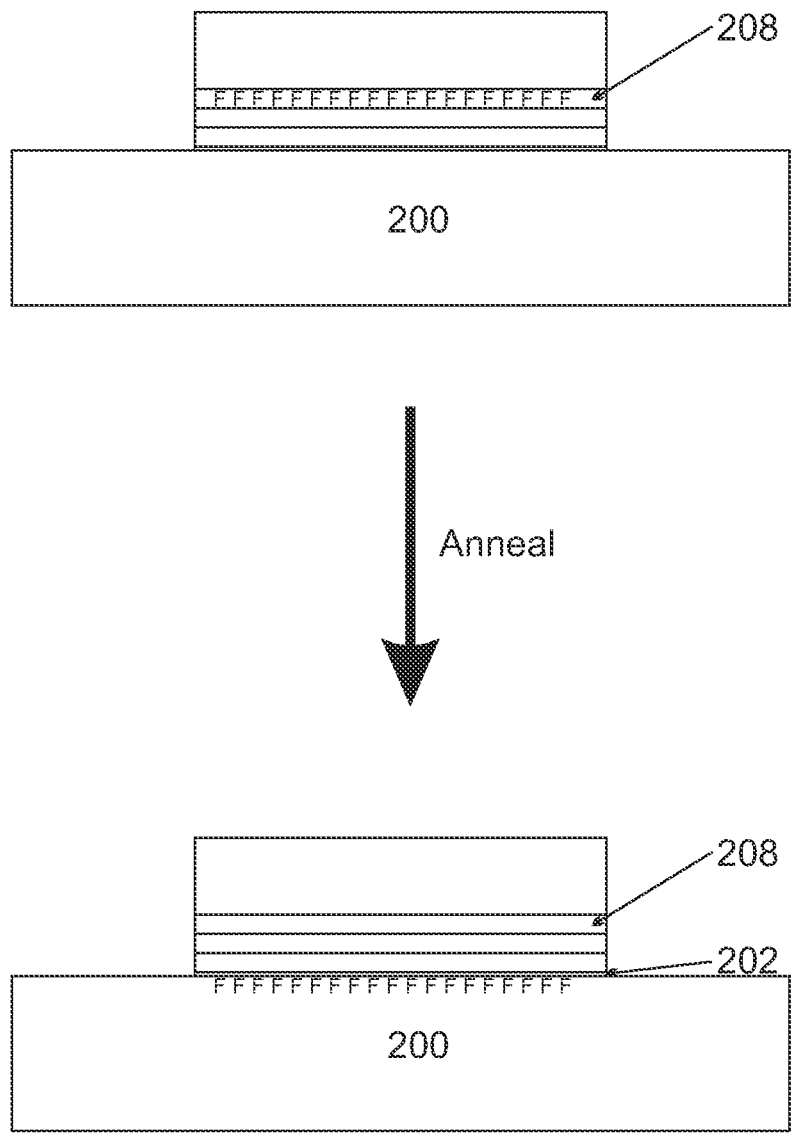
FIG. 2 shows the migration of F atoms from the fluorine-containing layer to the top of the semiconductor substrate.

FIG. 2 illustrates the process by which fluorine is introduced to the semiconductor surface to stabilize the interface between the semiconductor surface and adjacent device layers or components. The layer structure shown in FIG. 2 is similar to that shown in FIG. 1. In some embodiments, a portion 108 (208 in FIG. 2) of the work-function-adjustment layer is used to introduce a precise amount of fluorine into the gate stack. For example, the work-function-adjustment layer 106 can comprise $WSi_x$, while a portion of the work-function-adjustment layer 208 (and 108), can comprise $WSi_x$ and F deposited by chemical vapor deposition (CVD) or atomic layer deposition (ALD), using for example, $WF_6$ and $SiH_4$ precursor gases. A substantial amount of fluorine remains incorporated, but weakly bound, in the layer. A subsequent annealing step allows the F atoms to migrate through the high-κ dielectric and interface oxide layers from the fluorine-containing layer 208 to the surface of semiconductor 200 and bind with the dangling Si or Ge atoms adjacent to the IL 202 as illustrated in FIG. 2. Typically, the annealing is performed at a temperature from about 400° C. to about 750° C. for 1-30 min. Annealing can be performed either in a batch furnace or using a Rapid Thermal Annealer.

In some embodiments, approximately $10^{12}$ F atoms/cm$^2$ are provided in the second layer (e.g., 208 in FIG. 2) to match the number of dangling Si atoms on the surface of the Si substrate (or on the surface of a layer of $SiO_2$ such as IL 202). Control over the supply of F atoms can be achieved by adjusting the thickness of the fluorine-doped $WSi_x$ layer, and the concentration of F atoms in the layer. For example, a 1-nm layer with a concentration of about $10^{19}$ F atoms/cm$^3$ can provide an appropriate supply of fluorine atoms, although the specific concentrations and layer thicknesses can vary. Typically, it is preferable to provide just enough F atoms to passivate all dangling bonds. An excess of fluorine can result in fluorination of additional bulk silicon in a way that increases the overall dielectric thickness. In some embodiments, this thickness may not be sufficient to provide the desired work-function adjustment. In these embodiments, a larger thickness for the work function adjustment can be provided by using $WF_6$ as a tungsten precursor only until sufficient F atoms are deposited, then switching to a tungsten precursor not containing fluorine. Examples of such alternate precursor gases include tungsten carbonyl, mesitylene tungsten tricarbonyl, and bis(cyclopentadienyl)tungsten(IV) dihydride among many others readily available from CVD precursor gas suppliers. In this way, independent control over the thickness of the work-function-adjustment layer and the supply of F atoms can be achieved.

If the work function of the $WSi_x$ is not of the right magnitude, a layer with the desired work function can be deposited in addition to the F containing $WSi_x$. The additional work-function-adjustment layer may or may not comprise tungsten silicide, for example, it can be a metal nitride. F will typically diffuse through most films and the thickness of the $WSi_x$ can be adjusted to ensure that, given the overall kinetics of F diffusion through the bottom layers, the desired amount of F makes it to the interface. In some embodiments, the thicker work-function layer is deposited before the fluorine-containing layer; in some embodiments the layer order is reversed.

In some embodiments, other transition metals can be substituted for some or all of the tungsten in the work-function-adjustment layer. While $WF_6$ is a convenient precursor gas to use, having a melting point of 2° C. and a boiling point of 17° C., hexafluorides of several transition metals exist, including hexafluorides of Mo, Ru, Rh, Re, Os, Ir, and Pt. All of these transition metals also have available precursor gases not containing fluorine. In some embodiments, any metal for which a fluorine-containing precursor is available can be used to form the work-function-adjustment layer. While it can be useful to have both a fluorine-containing and a fluorine-free precursor, the fluorine-free precursor is not always needed, and in some embodiments, only a fluorine-containing metal precursor is used.

Figure 3:
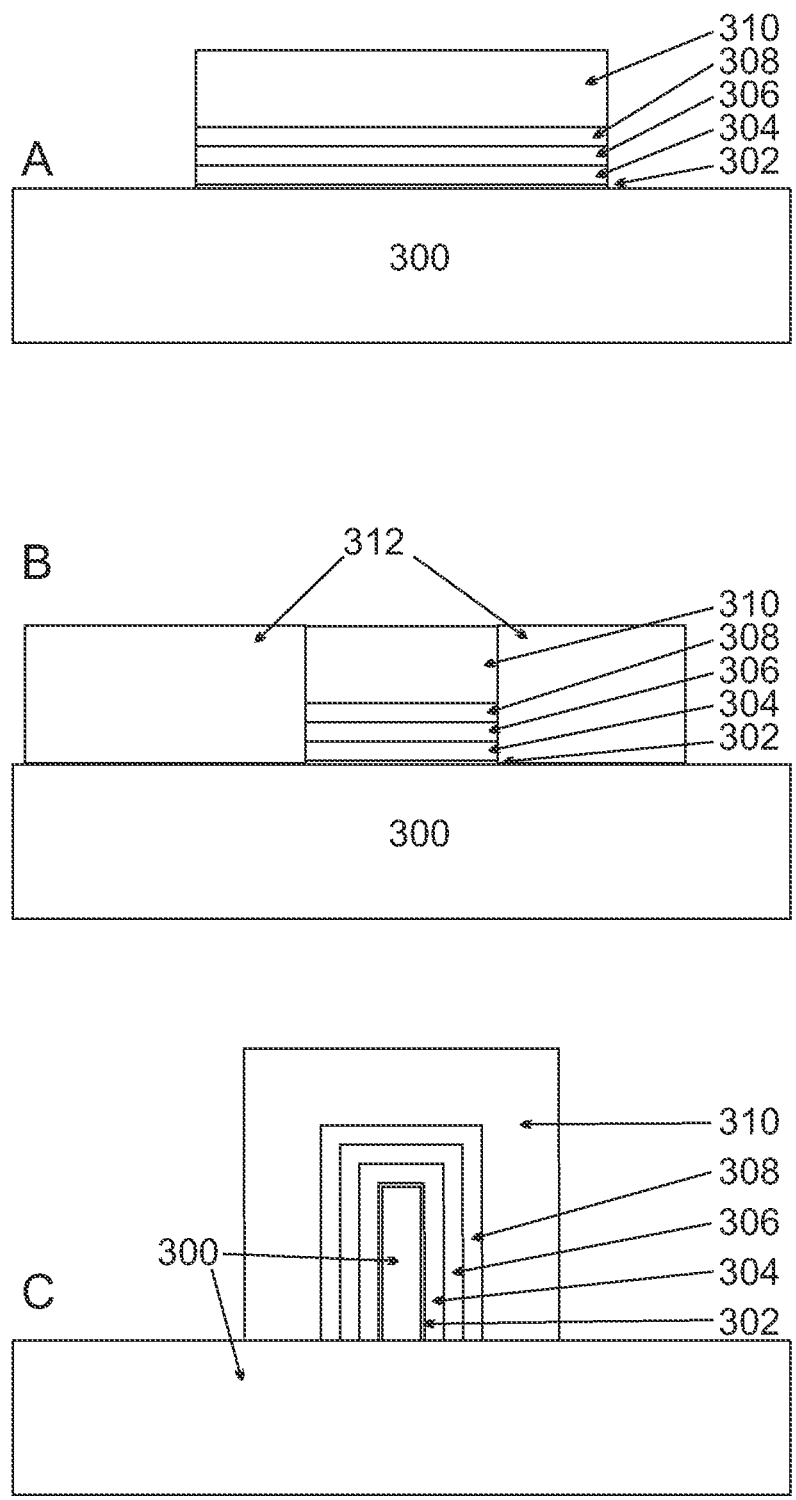
FIG. 3 shows three alternate gate stacks illustrating embodiments of the invention.

The methods described above are not limited to any particular layer geometry. Three exemplary geometries are shown in cross-section in FIG. 3 for both planar and three-dimensional transistor geometries. While the geometric arrangement varies, in all three cases, the same exemplary layer order is used: semiconductor substrate 300, IL 302, high-κ dielectric 304, work-function-adjustment layer 306, F-containing layer 308, and a fill/bulk layer 310. FIG. 3A shows a planar gate-first stack (as in FIG. 1). FIG. 3B shows a planar gate-last stack, where the stack is built in a well in an interlayer oxide layer 312. FIG. 3C shows a FinFET fin having a three-dimensional structure with the same set of layers as depicted in FIGS. 3A and 3B.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method of forming an electronic device, the method comprising:
    forming a first layer above a surface of a substrate,
        wherein the first layer comprises a high-κ dielectric material,
        wherein the high-κ material is hafnium oxide, and
        wherein the substrate comprises a semiconductor, forming a second layer above the first layer,
        wherein the second layer comprises tungsten silicide and fluorine, and
        wherein the second layer is operable as at least a portion of a work-function-adjustment layer, and
    annealing the first layer and the second layer such that at least a portion of fluorine migrates from the second layer to the surface of the substrate and binds to semiconductor atoms on a surface of the first layer,
        wherein a fluorine amount in the second layer is such that a capacitance equivalent thickness of the first layer is not changed during annealing.

2. The method of claim 1, wherein the substrate is a Group IV semiconductor or a Group III-V semiconductor.

3. The method of claim 2, wherein the Group IV semiconductor comprises one or more of silicon, or germanium.

4. The method of claim 1, wherein the second layer is formed by chemical vapor deposition (CVD) or atomic layer deposition (ALD).

5. The method of claim 1, wherein the amount of fluorine in the second layer is between about $1 \times 10^{11}$ F atoms per $cm^2$ and about $1 \times 10^{13}$ atoms per $cm^2$.

6. The method of claim 1, wherein the amount of fluorine in the second layer is sufficient to bond to substantially all dangling semiconductor atoms at the surface of the substrate and sufficient to displace substantially all hydrogen atoms present at the surface of the substrate.

7. The method of claim 1, wherein the tungsten silicide is formed by CVD or ALD using a precursor gas comprising $WF_6$.

8. The method of claim 1, further comprising forming a third layer between the substrate and the first layer, wherein the third layer comprises an oxide.

9. The method of claim 8, wherein the third layer comprises 2-5 monolayers.

10. The method of claim 1, further comprising forming a fourth layer, wherein the fourth layer is operable as a work-function-adjustment layer.

11. The method of claim 10, wherein the work-function-adjustment layer comprises a metal silicide or a metal nitride.

12. The method of claim 11, wherein the work-function-adjustment layer comprises tungsten silicide.

13. The method of claim 10, wherein the fourth layer is disposed between the first layer and the second layer.

14. The method of claim 10, wherein the second layer is disposed between the first layer and the fourth layer.

15. The method of claim 10, wherein the fourth layer comprise a metal silicide.

16. The method of claim 10, wherein the work-function-adjustment layer does not contain fluorine.

17. The method of claim 1, wherein, during annealing, Si—F bonds are formed on the on the surface of the first layer.

18. The method of claim 1, wherein, during annealing, the least a portion of fluorine displaces some of oxygen atoms from the surface of the first layer thereby increasing a dielectric thickness of the first layer.

19. The method of claim 1, wherein tungsten silicide has a stoichiometric formula of $WSi_x$ such that x is in a range of 2.0-2.2.

20. The method of claim 1, wherein annealing is performed at a temperature from about 400° C. to about 750 ° C.

* * * * *